United States Patent
Chen et al.

(10) Patent No.: US 9,529,262 B2
(45) Date of Patent: Dec. 27, 2016

(54) CLEANING DEVICE AND LINEAR COATING MACHINE

(71) Applicants: BOE TECHNOLOGY GROUP CO., LTD., Beijing (CN); BEIJING BOE DISPLAY TECHNOLOGY CO., LTD., Beijing (CN)

(72) Inventors: Qichao Chen, Beijing (CN); Tao Wang, Beijing (CN); Pan Zhu, Beijing (CN); Lei Wu, Beijing (CN); Peng Wang, Beijing (CN); Guo Chen, Beijing (CN); Min Zhang, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/429,852

(22) PCT Filed: Jul. 31, 2014

(86) PCT No.: PCT/CN2014/083401
§ 371 (c)(1),
(2) Date: Mar. 20, 2015

(87) PCT Pub. No.: WO2015/043312
PCT Pub. Date: Apr. 2, 2015

(65) Prior Publication Data
US 2016/0026082 A1    Jan. 28, 2016

(30) Foreign Application Priority Data
Sep. 27, 2013    (CN) .......................... 2013 1 0452360

(51) Int. Cl.
*B08B 7/00*    (2006.01)
*B08B 1/04*    (2006.01)
(Continued)

(52) U.S. Cl.
CPC . *G03F 7/16* (2013.01); *B05C 9/12* (2013.01); *B08B 1/002* (2013.01); *B08B 1/007* (2013.01);
(Continued)

(58) Field of Classification Search
None
See application file for complete search history.

(56) References Cited

U.S. PATENT DOCUMENTS 3,932,910 A * 1/1976 Shimoda ................. G03G 21/12
15/256.52
4,282,626 A * 8/1981 Schneider ................. B08B 5/02
15/320
(Continued)

FOREIGN PATENT DOCUMENTS

CN    1166386 A    12/1997
CN    1695822 A    11/2005
(Continued)

OTHER PUBLICATIONS

Second Chinese Office Action of Chinese Application No. 201310452360.0, mailed Sep. 7, 2015 with English translation.
(Continued)

*Primary Examiner* — Binu Thomas
(74) *Attorney, Agent, or Firm* — Collard & Roe, P.C.

(57) ABSTRACT

A cleaning device (10) for a linear coating machine table comprising a vacuum suction device (1) having a plurality of first suction ports (11) facing a surface of an object to be cleaned; and at least one sticky roller (12) pivoted to the vacuum suction device (1) and being rotatable, the sticky roller (12) configured to adhere impurities on the surface of the object to be cleaned is provided. By sucking small particles on the linear coating machine table by the vacuum suction device (11) and by adhering relative large particles by the sticky roller (12), the cleanness of the linear coating (Continued)

machine table is improved, and hence the coating effect of a substrate is improved. A linear coating machine is also provided.

16 Claims, 2 Drawing Sheets

(51) Int. Cl.
- *B08B 5/04* (2006.01)
- *B08B 15/04* (2006.01)
- *B05C 5/00* (2006.01)
- *G03F 7/16* (2006.01)
- *B08B 7/02* (2006.01)
- *B05C 9/12* (2006.01)
- *B08B 1/00* (2006.01)
- *B08B 7/04* (2006.01)
- *B05C 9/10* (2006.01)

(52) U.S. Cl.
CPC . *B08B 1/04* (2013.01); *B08B 5/04* (2013.01); *B08B 7/0028* (2013.01); *B08B 7/02* (2013.01); *B08B 7/04* (2013.01); *B08B 15/04* (2013.01); *B05C 9/10* (2013.01)

(56) References Cited

U.S. PATENT DOCUMENTS

| | | | | |
|---|---|---|---|---|
| 4,878,093 A | * | 10/1989 | Edmunds | G03G 21/0005 399/347 |
| 4,982,469 A | * | 1/1991 | Nishiwaki | B08B 1/00 15/102 |
| 6,634,192 B2 | | 10/2003 | Simonetti et al. | |
| 2005/0235910 A1 | * | 10/2005 | Teng | B05C 9/10 118/302 |
| 2007/0172275 A1 | * | 7/2007 | Lundy | G03G 21/0011 399/349 |
| 2008/0282500 A1 | * | 11/2008 | Omagari | B08B 5/02 15/415.1 |
| 2009/0208654 A1 | * | 8/2009 | MacFarlane | B08B 1/007 118/300 |

FOREIGN PATENT DOCUMENTS

| | | |
|---|---|---|
| CN | 101090776 A | 12/2007 |
| CN | 101284604 A | 10/2008 |
| CN | 202527419 U | 11/2012 |
| CN | 202606424 U | 12/2012 |
| CN | 203061462 U | 7/2013 |
| CN | 103521479 A | 1/2014 |

OTHER PUBLICATIONS

International Search Report with Notice of Transmittal of the International Search Report PCT/CN2014/083401 in Chinese, mailed Oct. 27, 2014.
Written Opinion of the International Searching Authority of PCT/CN2014/083401 in Chinese with English translation mailed Oct. 27, 2014.
Chinese Office Action of Chinese Application No. 201310452360.0 mailed Dec. 31, 2014 with English translation.

* cited by examiner

CLEANING DEVICE AND LINEAR COATING MACHINE

CROSS REFERENCE TO RELATED APPLICATIONS

This application is the National Stage of PCT/CN2014/083401 filed on Jul. 31, 2014, which claims priority under 35 U.S.C. §119 of Chinese Application No. 201310452360.0 filed on Sep. 27, 2013, the disclosure of which is incorporated by reference.

TECHNICAL FIELD

Embodiments of the present disclosure relate to a cleaning device and a linear coating machine comprising the cleaning device.

BACKGROUND

Coating photoresist is an important step in a photolithograph process, which requires high precision of a coating apparatus, and the evenness of a machine table of the linear coating apparatus will directly influence the coating effect of the photoresist. If there are impurities on the machine table, a saddleback will occur on a substrate when it is placed on the machine table, resulting in an uneven surface on the substrate, causing non-uniform coating upon coating, causing various defects or poor quality in the product, or even interrupting the coating, breaking the glass or damaging the coating apparatus when the impurities are relative large, which will severely affect product yield and stability of the apparatus.

There is not any device for cleaning a linear coating machine table in current coating apparatuses, only after the product defects are found, or an alarm is raised and the apparatus is shut down, an operator enters the coating apparatus and cleans the linear coating machine table manually by means of cleaning cloth or a sticky roller. With the above cleaning tool, not only the cleaning effect is limited, but also the efficiency is low.

SUMMARY

Embodiments of the present disclosure provide a cleaning device and a linear coating machine for improving the cleanness of the linear coating machine and thus improving the coating effect of the substrate.

At least one embodiment of the present disclosure provides a cleaning device comprising:

a vacuum suction device having a plurality of first suction ports towards a surface of an object to be cleaned;

at least one sticky roller, which is pivoted to the vacuum suction device and is rotatable, for adhering impurities on the surface of the object to be cleaned.

In the above technical solution, small particles on the surface of the object to be cleaned are sucked up by the vacuum suction device and relative large particles are adhered by the sticky roller, the cleanness of the surface of the object is improved. By applying such a cleaning device to a linear coating machine, the cleanness of a linear coating machine table can be improved, and thus the coating effect on the substrate can be improved.

In one embodiment according to the present disclosure, the vacuum suction device has a recess for accommodating the sticky roller, and the recess is located between two adjacent first suction ports, and the sticky roller is provided in the recess and partly protrudes therefrom to contact the surface of the object to be cleaned. By providing the sticky roller into the recess of the vacuum suction device, volume of the cleaning device can be effectively reduced, and at the same time, by disposing the sticky roller between two suction ports, it can be avoided that the sticky roller adheres relative small particles, and thus the operation efficiency of the sticky roller can be improved.

In one embodiment according to the present disclosure, a roller brush is provided on a wall of the recess, and the wall of the recess below the roller brush is provided with a containing groove for containing imparities brushed off by the roller brush. The containing groove is provided with a second suction port for sucking the imparities therein. By removing imparities adhered to the sticky roller by means of the roller brush, it is guaranteed that the sticky roller can be sufficiently contacted with the linear coating machine table, and the operation efficiency of the sticky roller is improved.

In one embodiment according to the present disclosure, a plurality of suction holes, for drawing the imparities brushed off by the roller brush, are provided on the wall of the recess. By drawing the relative small particles brushed off by the roller brush through the suction holes, the relative small particles can be prevented from falling onto the linear coating machine table, and the cleaning effect of the cleaning device is improved.

In one embodiment according to the present disclosure, the cleaning device further comprises at least one polishing member provided on a case of the vacuum suction device and used to nib the impurities on the surface of the object to be cleaned. By rubbing the impurities attached to the linear coating machine table through the polishing member, the cleaning effect of the cleaning device can be further improved.

In one embodiment according to the present disclosure, the polishing member is connected to the vacuum suction device through an elastic member such as a spring, an elastic rubber, or the like. By elastically connecting the polish member to the vacuum suction device through the elastic member, it is guaranteed that the polishing member is fully contacted with the linear coating machine table under a certain contact pressure, so as to facilitate the polishing member to rub the impurities.

In one embodiment according to the present disclosure, the cleaning device comprises one said polishing member and two said sticky rollers with the polishing member being located between the two sticky rollers. By adhering the impurities rubbed off by the polishing member through the sticky rollers, the cleaning effect of the cleaning device can be improved.

In one embodiment according to the present disclosure, the cleaning device comprises one said polishing member located between two adjacent first suction ports. By sucking small particles rubbed off by the polishing member through the first suction ports, the cleaning effect of the cleaning device can be improved.

The present disclosure further provides a linear coating machine comprising:

a linear coating machine table having a first slide rail;

a coating device slidably fitted with the first slide rail;

any one of the cleaning device described above pivoted with the coating device and capable of being locked at a preset position; and a first driving device for driving the coating device to slide along the first slide rail.

In the above technical solution, for the linear coating machine, by cleaning the linear coating machine table through the cleaning device, the cleanness of the linear coating machine table is improved, and thus the coating effect of the substrate is improved.

The present disclosure further provides a linear coating machine comprising:

a linear coating machine table having a first slide rail and a second slide rail;

a coating device slidably fitted with the first slide rail;

a first driving device for driving the coating device to slide along the first slide rail; and any one of the above cleaning devices slidably fitted with the second slide rail.

In the above technical solution, for the linear coating machine, by cleaning the linear coating machine table through the cleaning device, the cleanness of the linear coating machine table is improved, and thus the coating effect of the substrate is improved.

In one embodiment according to the present disclosure, the cleaning device is slidably fitted with the second slide rail through a support bracket, and the cleaning device is slidably fitted on the support bracket, thus it is possible to prevent the cleaning device from interfering coating of the coating device.

In one embodiment according to the present disclosure, the linear coating machine further comprises a second driving device for driving the cleaning device to slide along the support bracket and a third driving device for driving the support bracket to slide along the second slide rail. By providing the driving device to drive the cleaning device, the operation efficiency of the cleaning device is improved.

In one embodiment according to the present disclosure, the linear coating machine further comprises a control unit connected to the second driving device and the third driving device for controlling the second driving device and third driving device to drive the cleaning device according to a preset route. By using the control unit, automation of the cleaning device is achieved, and the operation efficiency of the cleaning device is improved.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

In order to improve cleanness of a linear coating machine, and hence improve the coating effect of photoresist on a substrate, a cleaning device and a linear coating machine incorporating the cleaning device are provided by embodiments of the present disclosure. In technical solutions of the present disclosure, by sucking small impurities on the linear coating machine table by means of a vacuum suction device and adhering relative large impurities by means of a sticky roller, cleanness of the linear coating machine table is improved, and thus the coating effect of the substrate is improved. In order to make the object, technical solution and advantages of the present disclosure more clear, hereinafter, the present disclosure will be further described in detail by way of non-limiting embodiments as examples.

Figure 1:
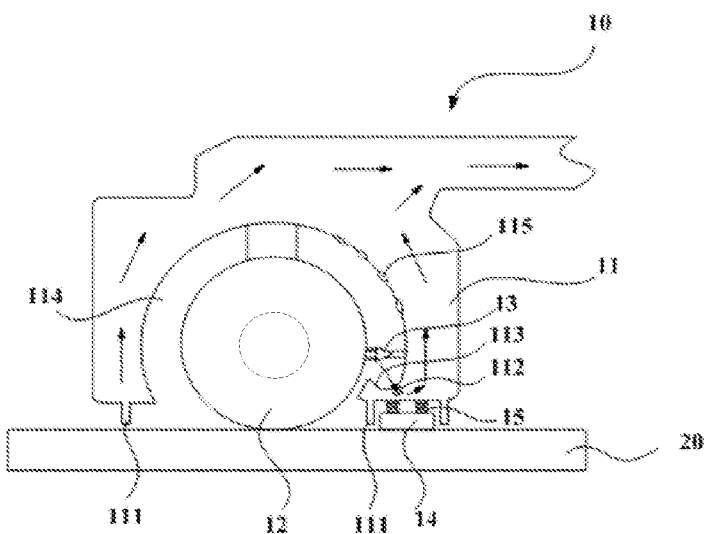
FIG. 1 is a schematic structural view of a cleaning device according to an embodiment of the present disclosure.

As illustrated in FIG. 1, FIG. 1 is a schematic structural view of a cleaning device according to an embodiment of the present disclosure.

A cleaning device, according to at least one embodiment of the present application, is applicable to a linear coating machine to clean a liner coating machine table. While the embodiment of the present disclosure is described by way of example that the cleaning device is used in a linear coating machine, the cleaning device provided by the embodiment of the present disclosure can also be used for cleaning other product or apparatus, such as operation table, test tables with high requirement on cleanness, glass substrates, panels, masks, various sheet plates, therefore, there is no limitation set forth on the application of the cleaning device in the present disclosure.

The cleaning device 10 comprises:

a vacuum suction device 11 having a plurality of first suction ports 111 facing a surface of an object to be cleaned;

at least one sticky roller 12 pivoted to the vacuum suction device 11 and is rotatable, for adhering impurities adhered on the surface of the object to be cleaned.

The object to be cleaned can be any kind of object, and the description below is provided by taking a linear coating machine table 20 as an example. In operation of the cleaning device 10 according to the present embodiment, the cleaning device 10 can be moved along the longitudinal direction of the linear coating machine table 20, and meanwhile, the plurality of first suction ports 111 of the vacuum suction device 11 facing the linear coating machine table 20 begins to suck impurities on the linear coating machine table 20, and some small impurities is sucked away by the vacuum suction device 11 through the first suction ports 111, and relative large particles on the linear coating machine table 20 is adhered by the sticky roller 12 pivoted to the vacuum suction device 11. By removing the impurities, whatever large or small, from the linear coating machine table 20 by the vacuum suction device 11 and the sticky roller 12, cleanness of the linear coating machine table 20 is improved, and hence the coating effect of the photoresist on the substrate is improved.

In the above embodiment, in order to further improve the cleaning effect of the linear coating machine table 20 by the cleaning device 10, the cleaning device 10 further comprises at least one polishing member 14 connected with the vacuum suction device 11. Impurities adhered on the linear coating machine table 20 is loosed under the action of the polishing member 14.

In the embodiment of the present disclosure, for example, an oilstone polish member 14 with good polishing effect can be used.

The structure of the vacuum suction device 11, the sticky roller 12 and the polish member 14 can be configured in various manners, and hereinafter, the structure thereof will be described with reference particular embodiments.

Embodiment One

Still referring to FIG. 1, the cleaning device 10 comprises one sticky roller 12, and the vacuum suction device 11 has a recess 114 for receiving the sticky roller 12, the sticky roller 12 is provided in the recess 114 and is pivoted to the vacuum suction device 11. And at this time, the sticky roller 12 is disposed between two adjacent first suction ports 111, and the contact point between the sticky roller 12 and a liner coating machine table 20 is lower than the positions of the suction ports, so as to guarantee that the sticky roller 12 is sufficiently contacted with the linear coating machine table 20 when the cleaning device 10 is moved along the linear coating machine table 20.

The impurities adhered to the sticky roller 12 will prevent the sticky roller 12 from sufficiently contacting with the linear coating machine table 20 when in operation, in order to improve the cleaning effect of the sticky roller 12, a roller brush 13 is provided on the wall of the recess 114. When the sticky roller 12 rotates, the roller brush 13 is capable of brushing off the impurities adhered to the sticky roller. And among the impurities brushed off, impurities with relative small sizes are sucked away by the suction ports 115 provided on the wall of the recess 114 and communicated with the vacuum suction device 11, and impurities with relative large sizes falls into a containing groove 113 provided on the wall of the recess below the roller brush 13 under their own gravities, and then is sucked into the vacuum suction device 11 through a second suction port 112 provided in the containing groove 113 and communicated with the vacuum suction device 11. For example, as illustrated in FIG. 1, the roller brush 13 is provided in a horizontal plane in which the axis of the roller is located, and at this time, whatever the roller rotates in the clockwise or counterclockwise direction, it is possible to guarantee that the impurities with relative large particles brushed off by the roller brush 13 falls into the containing groove 113 under their own gravities. Thus, it is possible to avoid the impurities brushed off to fall on the linear coating machine table 20 again such that the cleaning effect of the cleaning device 10 reduces. And meanwhile, in order to further improve the cleaning effect of the cleaning device 10, the sticky roller 12 is disposed between two first suction ports 111, thus it is guaranteed that even the impurities brushed off fall on the linear coating machine table 20 again, the impurities can also be sucked into the vacuum suction device 11 through the first suction ports 111, thus the cleaning effect of the cleaning device 10 is improved.

One or more polishing member(s) 14 can be provided in the cleaning device 10. For example, in the structure as illustrated in FIG. 1, one polishing member 14 is used, and the polishing member 14 is disposed between two adjacent first suction ports 111. And when the cleaning device 10 is used to clean the linear coating machine table 20, the impurities firmly adhered to the linear coating machine table 20 can be rubbed off by the polishing member 14, and are removed by the first suction ports 111 or the sticky roller 12. For example, as illustrated in FIG. 1, when the polishing member 14 is connected to the vacuum suction device 11, the polishing member 14 is disposed at the bottom of the cleaning device 10 and is elastically connected to the cleaning device 10 through an elastic member, such as an elastic rubber or a spring 15. Under the action of the spring and the elastic rubber, the polishing member 14 can be sufficiently contacted with the surface of the linear coating machine table 20, and thus the polishing effect of the polish member 14 can be improved.

Embodiment Two

Figure 2:
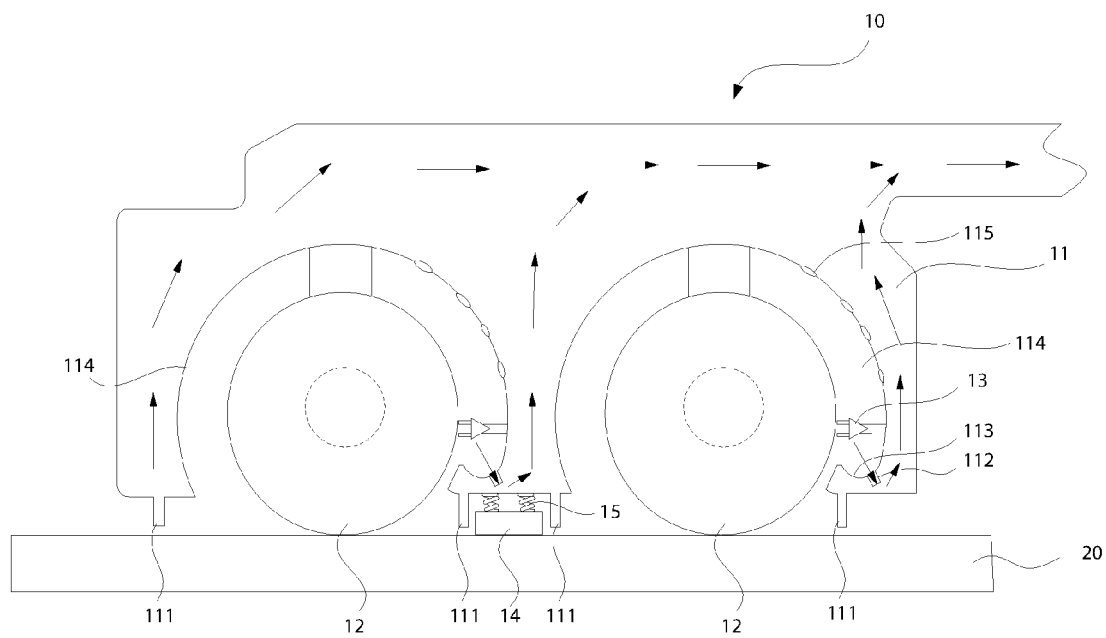
FIG. 2 is a schematic structural view of a cleaning device according to another embodiment of the present disclosure.

FIG. 2 is a schematic structural view illustrating a cleaning device according to another embodiment of the present disclosure. In the cleaning device, there are two sticky rollers 12, and one polishing member 14. The sticky rollers 12 are provided in the recess 114 of the vacuum suction device 11, and are pivoted to the vacuum suction device 11. At the same time, the sticky rollers 12 are located between two adjacent first suction ports 111, and the contact point between the sticky rollers 12 and the machine table to be cleaned is lower than the position of the suction ports, so as to guarantee that the sticky rollers 12 can be sufficiently contacted with the linear coating machine table 20 when the cleaning device 10 is moved on the linear coating machine table 20.

On the wall of the recess 114, a roller brush is provided for brushing off the impurities adhered to the sticky roller 12, and meanwhile, the wall of the recess 114 is further provided with suction holes 115 for sucking the brushed small impurities and a containing groove 113 for receiving relative large impurities brushed off. In the containing groove 113, a second suction port 112 communicated with the vacuum suction device 11 is provided to suck the relative large impurities brushed off. Thus, it is possible to guarantee the sticky roller 12 to be sufficiently contacted with the machine table when cleaning and to improve the cleaning effect.

The polishing member 14 is provided between the two sticky rollers 12. As the cleaning device 10 reciprocates when cleaning the linear coating machine table 20, the impurities rubbed off by the polishing member 14 is located at both sides of the polishing member 14. When the cleaning device 10 moves, impurities rubbed off and respectively located at both sides of the polishing member 14 can be adhered by the sticky rollers 12. For example, referring to FIG. 2, when the sticky rollers 12 rotates clockwise, the impurities rubbed off by the polishing member 14 are located at the right side of the polishing member 14, when the cleaning device 10 moves to one end of the linear coating machine table 20, the movement direction of the cleaning device 10 is changed, and the sticky roller 12 are started to rotate counterclockwise, and then, the rubbed-off impurities located at the right side of the polishing member 14 can be adhered by the sticky rollers 12, and are eventually sucked into the vacuum suction device 11 through the suction hole 115 and the second suction port 112. When the sticky rollers 12 rotate counterclockwise, the impurities rubbed off by the polishing member 14 are located at the left side of the polishing member 14, and when the movement direction of the cleaning device 10 is changed again, the rubbed-off impurities located at the left side can be adhered by the left sticky roller 12, and are eventually sucked into the vacuum, suction device 11 for further process.

When the polishing member 14 is connected with the vacuum suction device 11 in an elastic manner, for example through a spring 15 or an elastic rubber, so as to guarantee the polish member 14 to be sufficiently contacted with the linear coating machine table 20 when in operation.

The above embodiment one and the embodiment two illustrate the structures of two kinds of cleaning device 10, but it should be noted that the present disclosure is not limited to the two structures as exemplified in the above embodiments, and any combination of the vacuum suction device 11, the sticky roller 12 and the polish member 14 can be used, and will not be described further.

When the cleaning device 10 as provided by the embodiment of the present disclosure is in operation, the cleaning device 10 can be pulled manually or by a driving device so as to reciprocate on the linear coating machine table 20. In this case, the linear coating machine table 20 is provided with a slide rail thereon, and the cleaning device 10 is slidably fitted with the slide rail, and is driven by the driving device to slide on the slide rail. In one embodiment of the present disclosure, the movement of the driving device is controlled by a control unit, so that the cleaning device 10 can be routed to achieve an automatic cleaning. The operator can select various driving manners to drive the cleaning device 10 according to actual situations.

Figure 3:
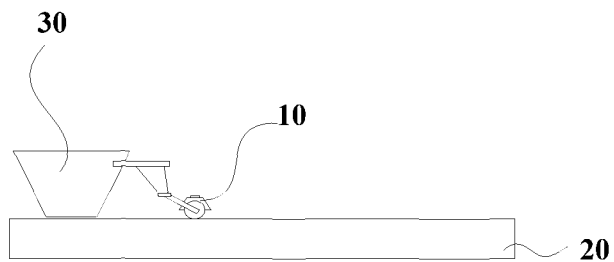
FIG. 3 is a schematic structural view of a linear coating machine according to an embodiment of the present disclosure.
Figure 4:
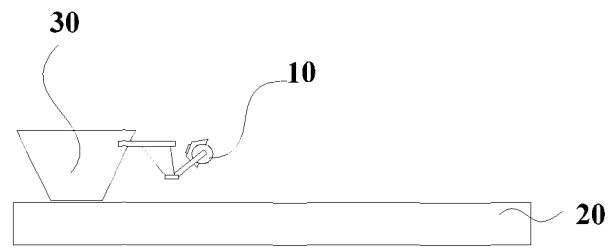
FIG. 4 is a schematic structural view of a folded state of a cleaning device of a linear coating machine according to an embodiment of the present disclosure.

As illustrated in FIG. 3 and FIG. 4, FIG. 3 is a schematic structural view of the linear coating machine according to an embodiment of the present disclosure, and FIG. 4 is a schematic structural view of a folded cleaning device of the linear coating machine according to an embodiment of the present disclosure.

An embodiment of the present disclosure further provides a linear coating machine comprising a linear coating machine table 20 provided with a first slide rail; a coating device 30 slidably fitted on the first slide rail; any one of the above cleaning devices 10 pivoted to the coating device 30 and lockable at a preset position; and a first driving device 60 for driving the coating device 30 to slide on the first slide rail.

As illustrated in FIG. 4, the cleaning device 10 is pivoted to the coating device 30 through a connecting bracket, and when the coating device 30 is performing coating on a substrate, the cleaning device 10 is turned so that the cleaning device 10 is located at an idle position and is locked at the position, and the coating device 30 is driven by the first driving device 60 and performs the coating normally. Still referring to FIG. 3, when the linear coating machine table 20 is needed to be cleaned by the cleaning device 10, the cleaning device 10 is released, and the cleaning device 10 is turned so that the cleaning device 10 is contacted with the surface of the linear coating machine table 20 and there is a suitable contact pressure between the cleaning device 10 and the linear coating machine table 20, to facilitate the sticky roller 12 and the polish member 14 of the cleaning device 10 to clean impurities on the linear coating machine table 20. When the cleaning device is adjusted to be in place, the cleaning device 10 is locked, and by driving the coating device 30 to move by the first driving device 60, the cleaning device 10 is brought to reciprocate together with the coating device 30 to clean the linear coating machine table 20.

In the linear coating machine according to the embodiment of the present disclosure, by means of the cleaning device 10, cleanness of a surface of the linear coating machine table 20 is improved, and hence the coating effect of the substrate is improved.

In the above embodiment, a structure for locking the cleaning device 10 can be any suitable locking structure in the related art. For example, a structure, in which a locking pin is provided on a rotation shaft and the cleaning device 10 can be locked at different positions by inserting the locking pin into different holes, can be used, or a threaded locking structure can be used, wherein a locking bolt is provided on a sleeve in which the rotation shaft is inserted, and when the locking bolt is released, the rotation shaft is allowed to rotate, and when the locking bolt is screwed, the rotation shaft is locked. It should be noted that the locking structure used in the embodiment of the present disclosure is not limited to the two common locking structure as exemplified above, and any of well known locking structure can be used and will not further enumerated.

The first driving device 60 in the above embodiment can be a step motor or a servo motor, which has good driving capacity and stable output.

Figure 5:
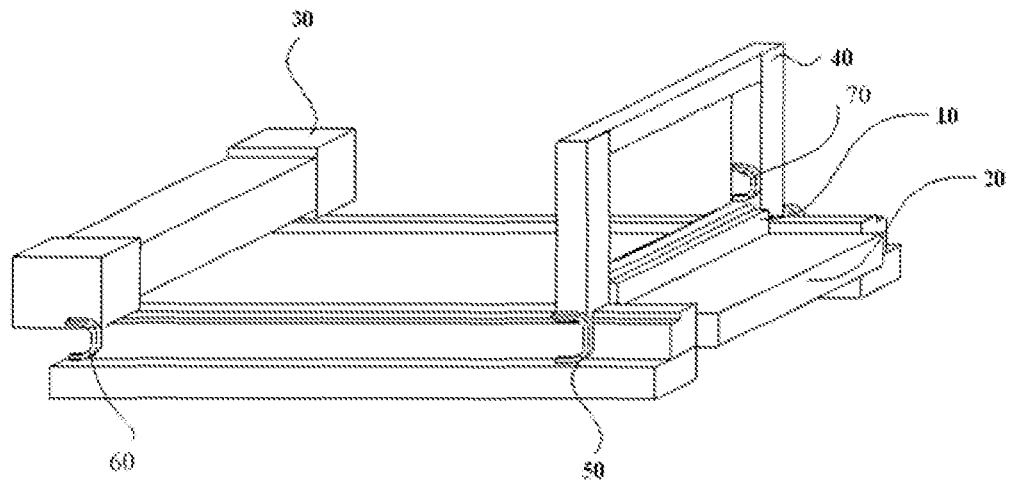
FIG. 5 is a schematic structural view of a linear coating machine according to an embodiment of the present disclosure.

As illustrated in FIG. 5, FIG. 5 is a schematic structural view of a linear coating machine as provided by an embodiment of the present disclosure. The embodiment of the present disclosure further provides another linear coating machine comprising: a linear coating machine table 20 having a first slide rail and a second slide rail; a coating device 30 slidably fitted on the first slide rail; a first driving device 60 configured to drive the coating device 30 to slide on the first slide rail; and any one of the above-described cleaning devices 10 slidably fitted on the second slide rail.

The cleaning device 10 is slidably fitted on the second slide rail through a support bracket 40 and the cleaning device 10 is slidably fitted on the support bracket 40. The cleaning device 10 can be pulled manually to clean the table. When the coating device 30 operates, the cleaning device 10 is located on the top of the support bracket 40 and is locked by a locking device, thus to avoid interrupting the operation of the coating device 30 on a substrate.

When the cleaning device 10 is driven by means of a driving device, the linear coating machine further comprises a second driving device 70 configured to drive the cleaning device 10 to slide along the support bracket 40 and a third driving device 50 configured to drive the support bracket 40 to slide along the second slide rail. For example, when the coating device 30 operates, the cleaning device 10 is located on the top of the support bracket 40, and the coating device 30 reciprocates on the first slide rail and performs coating on the substrate. When the linear coating machine table 20 is needed to be cleaned, by means of the second driving device 70, the cleaning device 10 is driven to slide from the top of the support bracket 40 to the bottom of the support bracket 40 and is brought to be sufficiently contacted with the linear coating machine table 20. The second driving device 70 is stopped, and at the same time, the support bracket 40 is driven by the third driving device 50 to slide on the second slide rail, and the cleaning device 10 is brought to reciprocate on the linear coating machine table 20 by the support bracket 40, and clean the linear coating machine table 20. Mechanization of cleaning the linear coating machine table is achieved, thus efficiency of cleaning the linear coating machine table 20 is improved, and at the same time, recontamination to the linear coating machine table 20 caused by the operator contacting with the linear coating machine table 20 can be avoided.

In one embodiment of the present disclosure, the linear coating machine further comprises a control unit commutatively connected with the second driving device 70 and the third driving device 50 configured to rout the second driving device 70 and the third driving device. When the linear coating machine table 20 is needed to be cleaned by the cleaning device 10, through the control unit controlling the second driving device 70 according to a preset process to lower down the cleaning device to the surface of the linear coating machine table 20, and controlling the third driving device 50 according to a preset process to drive the support bracket 40 to slide along the second slide rail, the cleaning device 10 is brought to reciprocate on the surface of the linear coating machine table 20 by the support bracket 40, and at the same time, the cleaning device 10 performs cleaning on the linear coating machine table 20.

In the linear coating machine according to the embodiments of the present disclosure, with the cleaning device 10, the cleanness of the linear coating machine table 20 is improved, and then effect of coating on the substrate is improved.

In the above embodiment, a step motor or a servo motor can be used as the first driving device 60, the second driving device 70 and the third driving device 50. The step motor or the servo motor has strong driving capacity and stable output. A PLC (programmable logic controller) or a single chip microcomputer can be configured as the control unit. For example, the control unit is a single chip microcomputer, and has good control performance.

The foregoing are merely exemplary embodiments of the disclosure, but are not used to limit the protection scope of the disclosure. The protection scope of the disclosure shall be defined by the attached claims.

The present application claims the priority of the Chinese patent application No. 201310452360.0 filed on Sep. 27, 2013, the disclosure of which is hereby entirely incorporated by reference.

The invention claimed is:

1. A cleaning device comprising:
    a vacuum suction device with a plurality of first suction ports facing a surface of an object to be cleaned;
    at least one sticky roller configured to adhere impurities on the surface of the object to be cleaned, the sticky roller being pivoted to the vacuum suction device and being rotatable;
    wherein the cleaning device further comprising at least one oilstone polish member provided on a case of the vacuum suction device and configured to rub the impurities on the surface of the object to be cleaned.

2. The cleaning device according to claim 1, wherein the vacuum suction device is provided with a recess for accommodating the at least one sticky roller, and the recess is arranged between two adjacent first suction ports, the at least one sticky roller is accommodated in the recess and is partially exposed.

3. The cleaning device according to claim 2, wherein a roller brush is provided on a wall of the recess, and a containing groove is provided on the wall of the recess below the roller brush, and a second suction port is provided in the containing groove.

4. The cleaning device according to claim 2, wherein a plurality of suction holes configured to suck impurities which are brushed off by a roller brush are provided on a wall of the recess.

5. The cleaning device according to claim 1, wherein the at least one oilstone polish member is connected to the vacuum suction device through an elastic member.

6. The cleaning device according to claim 1, wherein the cleaning device has one of the oilstone polish member and two of the sticky rollers with the oilstone polish member being arranged between the two sticky rollers.

7. The cleaning device according to claim 1, wherein the cleaning device has one of the oilstone polish member arranged between two adjacent first suction ports.

8. A linear coating machine comprising:
    a linear coating machine table having a first slide rail;
    a coating device slidably fitted on the first slide rail;
    a cleaning device according to claim 1, the cleaning device being pivoted to the coating device and being lockable at a preset position; and
    a first driving device for driving the coating device to slide along the first slide rail.

9. A linear coating machine comprising:
    a linear coating machine table having a first slide rail and a second slide rail;
    a coating device slidably fitted on the first slide rail;
    a first driving device configured to drive the coating device to slide along the first slide rail; and
    a cleaning device according to claim 1, slidably fitted on the second slide rail.

10. The linear coating machine according to claim 9, wherein the cleaning device is slidably fitted on the second slide rail through a support bracket, and the cleaning device is slidably fitted on the support bracket.

11. The linear coating machine according to claim 9, further comprising:
    a second driving device configured to drive the cleaning device to slide along the support bracket; and
    a third driving device configured to drive the support bracket to slide along the second slide rail.

12. The linear coating machine according to claim 11, further comprising:
    a control unit connected to the second driving device and the third driving device and controlling the second driving device and the third driving device to drive the cleaning device according to a preset route.

13. The cleaning device according to claim 3, wherein a plurality of suction holes configured to suck impurities which are brushed off by the roller brush are provided on a wall of the recess.

14. The cleaning device according to claim 5, wherein the cleaning device has one of the oilstone polish member and two of the sticky rollers with the oilstone polish member being arranged between the two sticky rollers.

15. The cleaning device according to claim 5, wherein the cleaning device has one of the oilstone polish member arranged between two adjacent first suction ports.

16. The linear coating machine according to claim 10, further comprising:
    a second driving device configured to drive the cleaning device to slide along the support bracket; and
    a third driving device configured to drive the support bracket to slide along the second slide rail.

* * * * *